(12) United States Patent
Yoshikawa et al.

(10) Patent No.: US 10,811,554 B2
(45) Date of Patent: Oct. 20, 2020

(54) INFRARED PHOTODETECTOR

(71) Applicants: Sharp Kabushiki Kaisha, Sakai, Osaka (JP); The University of Tokyo, Bunkyo-ku, Tokyo (JP)

(72) Inventors: Hirofumi Yoshikawa, Sakai (JP); Takahiro Doe, Sakai (JP); Yasuhiko Arakawa, Tokyo (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 16/441,048

(22) Filed: Jun. 14, 2019

(65) Prior Publication Data

US 2019/0393373 A1 Dec. 26, 2019

(30) Foreign Application Priority Data

Jun. 22, 2018 (JP) ................. 2018-118851

(51) Int. Cl.
*H01L 27/14* (2006.01)
*H01L 31/101* (2006.01)
*H01L 31/0352* (2006.01)
*H01L 31/0304* (2006.01)

(52) U.S. Cl.
CPC ...... *H01L 31/101* (2013.01); *H01L 31/03046* (2013.01); *H01L 31/035218* (2013.01)

(58) Field of Classification Search
CPC ............. H01L 31/101; H01L 31/03046; H01L 31/035218
See application file for complete search history.

(56) References Cited

U.S. PATENT DOCUMENTS 9,748,427 B1 * 8/2017 Rajavel ............ H01L 31/102
2007/0215858 A1 9/2007 Uchiyama et al.

FOREIGN PATENT DOCUMENTS

JP 2007-250648 A 9/2007

OTHER PUBLICATIONS

Chakrabarti et al., "High-performance mid-infrared quantum dot infrared photodetectors", Journal of Physics D: Applied Physics, 38, Jun. 17, 2005, pp. 2135-2141.

(Continued)

*Primary Examiner* — Victor A Mandala
*Assistant Examiner* — Colleen E Snow
(74) *Attorney, Agent, or Firm* — Keating & Bennett, LLP

(57) ABSTRACT

A high detectivity infrared photodetector is provided. An infrared photodetector 10 includes n-type semiconductor layers 3 and 5 and a photoelectric conversion layer 4. The photoelectric conversion layer 4 includes quantum dots 411, a barrier layer 42, and a single-sided barrier layer 43. The single-sided barrier layer 43 is inserted between the barrier layer 42 and the n-type semiconductor layer 5 and has a wider band gap than does the barrier layer 42. Letting y be an energy level difference between the bottom of the conduction band of the single-sided barrier layer 43 and the bottom of the conduction band of the n-type semiconductor layer 5, z be a voltage in volts applied to the photoelectric conversion layer 4, and d be a thickness in nanometers of the photoelectric conversion layer 4, the infrared photodetector 10 satisfies $y \geq 27 \times \exp(0.64 \times z/(d \times 10000))$.

8 Claims, 8 Drawing Sheets

(56) References Cited

OTHER PUBLICATIONS

Chakrabarti et al., "High-Temperature Operation of InAs—GaAs Quantum-Dot Infrared Photodetectors With Large Responsivity and Detectivity", IEEE Photonics Technology Letters, vol. 16, No. 5, May 2004, pp. 1361-1363.

Liu et al., "Performance investigations of quantum dot infrared photodetectors", Infrared Physics and Technology, 55, Mar. 14, 2012, pp. 320-325.

Lin et al., "Sequential coupling transport for the dark current of quantum dots-in-well infrared photodetectors", Applied Physics Letters 97, 193511, Nov. 12, 2010, 4 pages.

\* cited by examiner (a)

(b)

(a)

(b)

(c)

(d)

(e)

(f)

(g)

(h)

INFRARED PHOTODETECTOR

FIELD OF THE INVENTION

The present invention relates to infrared photodetectors.

BACKGROUND OF THE INVENTION

QDIPs (quantum-dot infrared photodetectors) that exploit intersubband transition are expected to exhibit high sensitivity, good high-temperature operability, quick response, and good wavelength selectivity. There are active research efforts going on to develop such quantum infrared photodetectors.

Despite the efforts, high-temperature operability has so far not been achieved due to large dark current and resultant low sensitivity (detectivity).

Patent Literature 1 discloses a structure aimed at lowering dark current, where there is provided a p-type semiconductor layer between a photoelectric conversion layer and a n-type contact layer that is provided on one of the faces of the photoelectric conversion layer to form a barrier to electrons.

Non-patent Literature 1 discloses another structure aimed at lowering dark current, where there is provided a single $Al_{0.3}Ga_{0.7}As$ barrier between a photoelectric conversion layer and a n-type contact layer that is provided on one of the faces of the photoelectric conversion layer.

CITATION LIST

Patent Literature

Patent Literature 1: Japanese Unexamined Patent Application Publication, Tokukai, No. 2007-250648

Non-Patent Literature

Non-patent Literature 1: S. Chakrabarti, A. D. Stiff-Roberts, P. Bhattacharya, Fellow IEEE, S. Gunapala, S. Bandara, S. B. Rafol, and S. W. Kennerly, "High-Temperature Operation of InAs—GaAs Quantum-Dot Infrared Photodetectors With Large Responsivity and Detectivity", IEEE PHOTONICS TECHNOLOGY LETTERS, VOL. 16, NO. 5, May 2004.

Non-patent Literature 2: H. Liu and J. Zhang, "Performance investigations of quantum dot infrared photodetectors", Infrared Physics & Technology 55 (2012) 320.

Non-patent Literature 3: L. Lin, H. L. Zhen, N. Li, W. Lu, Q. C. Weng, D. Y. Xiong, and F. Q. Liu, "Sequential coupling transport for the dark current of quantum dots-in-well infrared photodetectors", Appl. Phys. Lett. 97, 193511 (2010).

SUMMARY OF THE INVENTION

Problems to be Solved by the Invention

The structure disclosed in Patent Literature 1, including a p-type semiconductor layer, may facilitate carrier recombination and therefore cut back on carrier lifetime.

The structure disclosed in Non-patent Literature 1 includes a single barrier that has a small band gap. The band gap could be so small that the energy level difference between the bottom of the conduction band of the barrier layer and the bottom of the conduction band of the contact layer cannot be sufficiently amplified. The structure may result in lower detectivity at operating temperatures higher than or equal to room temperature than typical thermal infrared photodetectors.

In view of this situation, the present invention, in an embodiment thereof, provides an infrared photodetector that allows for improvement of detectivity.

Solution to the Problems

Arrangement 1

The present invention, in an embodiment thereof, is directed to an infrared photodetector including: a first contact layer; a second contact layer; and a photoelectric conversion layer provided between the first and second contact layers in contact with the first and second contact layers, the photoelectric conversion layer being doped with an impurity, wherein the photoelectric conversion layer includes: a quantum layer; a barrier layer; and a single-sided barrier layer provided between the barrier layer and the second contact layer in contact with the barrier layer and the second contact layer, the single-sided barrier layer having a wider band gap than does the barrier layer, and letting y be an energy level difference between a bottom of a conduction band of the single-sided barrier layer and a bottom of a conduction band of the second contact layer, z be a voltage in volts applied to the photoelectric conversion layer, and d be a thickness in nanometers of the photoelectric conversion layer, the infrared photodetector satisfies $y \geq 27 \times \exp(0.64 \times z/d \times 10000)$.

According to arrangement 1, the infrared photodetector allows for improvement of detectivity and is capable of operating at 75° C.

Arrangement 2

The infrared photodetector of arrangement 1 may satisfy $y \geq 38 \times \exp(0.63 \times z/d \times 10000)$ instead of $y \geq 27 \times \exp(0.64 \times z/d \times 10000)$.

According to arrangement 2, the infrared photodetector is capable of operating at 85° C.

Arrangement 3

The infrared photodetector of arrangement 1 may satisfy $y \geq 52 \times \exp(0.63 \times z/d \times 10000)$ instead of $y \geq 27 \times \exp(0.64 \times z/d \times 10000)$.

According to arrangement 3, the infrared photodetector is capable of operating at 125° C.

Arrangement 4

The infrared photodetector of arrangement 1 may satisfy $y \geq 45 \times \exp(0.63 \times z/d \times 10000)$ instead of $y \geq 27 \times \exp(0.64 \times z/d \times 10000)$.

According to arrangement 4, the infrared photodetector is capable of operating at 85° C. to detect infrared light across a wide range of spectrum.

Arrangement 5

The infrared photodetector of arrangement 1 may satisfy $y \geq 63 \times \exp(0.62 \times z/d \times 10000)$ instead of $y \geq 27 \times \exp(0.64 \times z/d \times 10000)$.

According to arrangement 5, the infrared photodetector is capable of operating at 125° C. to detect infrared light across a wide range of spectrum.

Arrangement 6

In the infrared photodetector of any one of arrangements 1 to 5, the photoelectric conversion layer may absorb infrared light by intersubband absorption.

According to arrangement 6, the infrared photodetector is capable of operating at temperatures higher than when the photoelectric conversion layer absorbs infrared light by intervalence-band absorption.

Arrangement 7

In the infrared photodetector of any one of arrangements 1 to 6, the quantum layer may contain quantum dots.

According to arrangement 7, the infrared photodetector is capable of operating at higher temperatures than is an infrared photodetector containing quantum wells.

Arrangement 8

In the infrared photodetector of any one of arrangements 1 to 7, voltage z in volts, applied to the photoelectric conversion layer, may be such as to place the second contact layer under negative bias.

According to arrangement 8, high activation energy becomes available.

Arrangement 9

In the infrared photodetector of any one of arrangements 1 to 8, both the first and second contact layers may be composed of n-type GaAs.

According to arrangement 9, the infrared photodetector allows for improvement of the quality of the photoelectric conversion layer.

Arrangement 10

In the infrared photodetector of any one of arrangements 1 to 9, the single-sided barrier layer may have a composition of $(Ga_{0.51}In_{0.49}P)_{1-x}(Al_{0.52}In_{0.48}P)_x$ (0.4<x≤1).

According to arrangement 10, the single-sided barrier layer provides good lattice matching with AlGaAs or GaAs.

Arrangement 11

In the infrared photodetector of any one of arrangements 1 to 9, the single-sided barrier layer may have a composition of AlAs.

According to arrangement 11, the single-sided barrier layer provides good lattice matching with a GaAs substrate, thereby amplifying the energy level difference between the bottom of the conduction band of the barrier layer and the bottom of the conduction band of the second contact layer.

Arrangement 12

In the infrared photodetector of any one of arrangements 1 to 11, voltage z in volts, applied to the photoelectric conversion layer, may be such that activation energy changes exponentially with respect to an electric field in the photoelectric conversion layer.

According to arrangement 12, the infrared photodetector allows for improvement of detectivity.

Advantageous Effects of the Invention

The present invention, in an embodiment thereof, provides an infrared photodetector that allows for improvement of detectivity.

DESCRIPTION OF EMBODIMENTS

Figure 1:
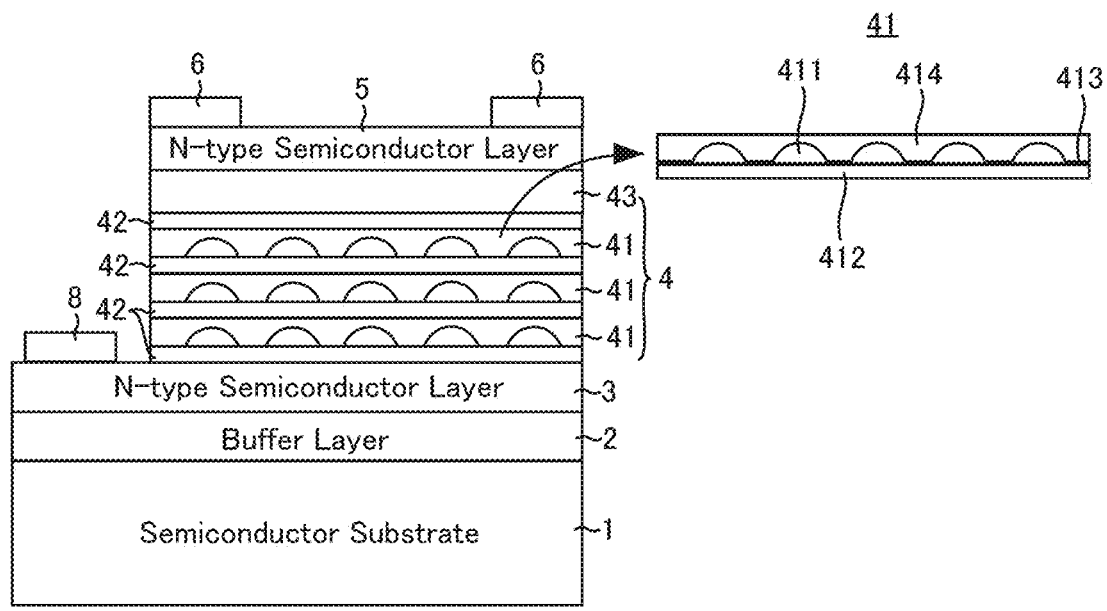
FIG. 1 is a cross-sectional view of an infrared photodetector in accordance with an embodiment of the present invention.

The following will describe embodiments of the present invention in detail in reference to drawings. Identical or equivalent members will be denoted by the same reference signs in the drawings, and description thereof is not repeated.

A description will be given of terms used in this specification.

A "quantum layer" includes, for example, quantum dots or quantum wells. A quantum layer and a barrier layer are stacked alternately to form a photoelectric conversion layer.

A "quantum-dot layer" may include quantum dots, a wetting layer, an intermediate layer, an underlayer for quantum dots, a partial capping layer for quantum dots, an insertion layer, and/or other layers.

"Quantum dots" are small semiconductor particles with particle sizes of 100 nm or less and surrounded by a semiconductor material that has a wider band gap than does the semiconductor material constituting the quantum dots. In Stranski-Krastanov (S-K) growth, a semiconductor material forms a wetting layer before growing into quantum dots.

An "underlayer for quantum dots" provides a base for growth of quantum dots and a wetting layer.

A "partial capping layer for quantum dots" is a layer grown over quantum dots and is composed of a semiconductor material that has a wider band gap than does the semiconductor material constituting the quantum dots. The partial capping layer covers at least parts of quantum dots. The partial capping layer is flat in FIG. 1 detailed below and may alternatively be shaped to fit the quantum dots. The partial capping layer in FIG. 1 has a thickness greater than or equal to the height of the quantum dots; alternatively, the thickness may be less than or equal to the height of the quantum dots.

A "barrier layer" is composed of a semiconductor material that has a wider band gap than does the semiconductor material constituting quantum dots and provides a base for a quantum-dot layer. The barrier layer may be composed of the same semiconductor material as the underlayer for quantum dots and the partial capping layer for quantum dots.

FIG. 1 is a cross-sectional view of an infrared photodetector in accordance with an embodiment of the present invention. Referring to FIG. 1, an infrared photodetector 10 in accordance with an embodiment of the present invention includes a semiconductor substrate 1, a buffer layer 2, n-type semiconductor layers 3 and 5, a photoelectric conversion layer 4, and electrodes 6 and 8.

The buffer layer 2 is provided on the semiconductor substrate 1 in contact with one of the faces of the semiconductor substrate 1. The n-type semiconductor layer 3 is provided on the buffer layer 2 in contact with the buffer layer 2.

The photoelectric conversion layer 4 is provided on the n-type semiconductor layer 3 in contact with the n-type semiconductor layer 3. The n-type semiconductor layer 5 is provided on the photoelectric conversion layer 4 in contact with the photoelectric conversion layer 4.

The electrode 6 is provided on the n-type semiconductor layer 5 in contact with the n-type semiconductor layer 5. The electrode 8 is provided on the n-type semiconductor layer 3 in contact with the n-type semiconductor layer 3.

The n-type semiconductor layer 3 may alternatively be referred to as the "first contact layer." The n-type semiconductor layer 5 may alternatively be referred to as the "second contact layer."

The semiconductor substrate 1 is composed of, for example, semi-insulating GaAs. The buffer layer 2 is composed of, for example, GaAs and has a thickness of, for example, 100 nm to 500 nm.

The n-type semiconductor layers 3 and 5 are composed of, for example, n-GaAs. The n-type semiconductor layers 3 and 5 each have a thickness of, for example, 100 nm to 1,000 nm.

The electrodes 6 and 8 are for use with n-type members and composed of, for example, any of Au/AuGeNi, AuGe/Ni/Au, Au/Ge, and Au/Ge/Ni/Au. The electrodes 6 and 8 each have a thickness of, for example, 10 nm to 500 nm.

The photoelectric conversion layer 4 has a layered structure including a stack of a plurality of quantum-dot layers 41, a plurality of barrier layers 42, and a single-sided barrier layer 43. FIG. 1 shows three quantum-dot layers 41 and four barrier layers 42 in the stack. The stack in the infrared photodetector 10 may include at least two or more quantum-dot layers 41 and at least two or more barrier layers 42.

Each quantum-dot layer 41 includes quantum dots 411, an underlayer 412 for the quantum dots 411, a wetting layer 413 for the quantum dots 411, and a partial capping layer 414 for the quantum dots 411.

The underlayer 412 is provided below the quantum dots 411. The wetting layer 413 is provided on the underlayer 412 in contact with the underlayer 412.

The quantum-dot layer 41 may include, for example, an insertion layer as well as the quantum dots 411, the underlayer 412 for the quantum dots 411, the wetting layer 413, and the partial capping layer 414 for the quantum dots 411.

The quantum-dot layer 41 typically includes at least the quantum dots 411 and the partial capping layer 414 for the quantum dots 411.

The quantum-dot layer 41 may be composed of any material and is preferably composed of a group III-V compound semiconductor.

The quantum dots 411 are preferably composed of a semiconductor material that has a smaller band gap energy than do the barrier layers 42.

The quantum-dot layer 41 is preferably composed of, for example, any of $GaAs_xSb_{1-x}$, AlSb, $InAs_xSb_{1-x}$, $Ga_xIn_{1-x}Sb$, $AlSb_xAs_{1-x}$, $AlAs_zSb_{1-z}$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_xP_{1-x}$, $Ga_xIn_{1-y}As_zP_{1-z}$, and $In_xAl_{1-x}As$ (throughout the rest of this document, $0 \le x \le 1$, $0 < y < 1$, and $0 < z < 1$ in these materials). Alternatively, the quantum-dot layer 41 may be composed of a mixed crystal of these materials.

The quantum-dot layer 41, which may be referred to as the "quantum layer," may be composed of a compound semiconductor of either a group-IV or group-III semiconductor material and a group-V semiconductor material in the periodic table and may be composed of a compound semiconductor of a group-II and a group-VI semiconductor material. Alternatively, the quantum-dot layer 41 may be composed of a mixed crystal of these materials. The quantum-dot layer 41 may be composed of a chalcopyrite-based material or a non-chalcopyrite semiconductor.

The photoelectric conversion layer 4 is doped with a p- or n-type impurity. In an embodiment of the present invention, the photoelectric conversion layer 4 has a quantum-dot layered structure that includes at least the quantum dots 411, the underlayer 412 for the quantum dots 411, the partial capping layer 414 for the quantum dots 411, and the barrier layers 42. The quantum dots 411, the underlayer 412, the partial capping layer 414, and the barrier layers 42 are composed of, for example, materials detailed below.

The quantum dots 411 are composed of InAs. The underlayer 412 is composed of InGaAs or GaAs. The partial capping layer 414, which may be referred to as the "barrier layer" throughout the rest of this document) is composed of InGaAs or GaAs. The barrier layers 42 are composed of GaAs.

The underlayer 412 and the partial capping layer 414 may alternatively be composed of AlGaAs, InGaP, or GaAsP.

Figure 2:
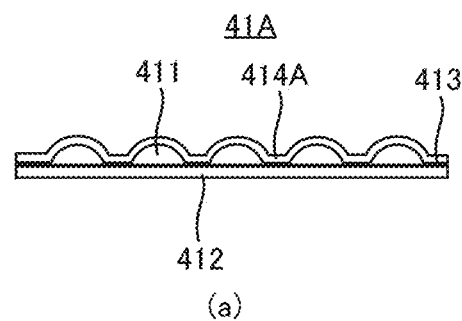
FIG. 2 is a set of cross-sectional views of alternative structures of a quantum-dot layer shown in FIG. 1.
Figure 2:
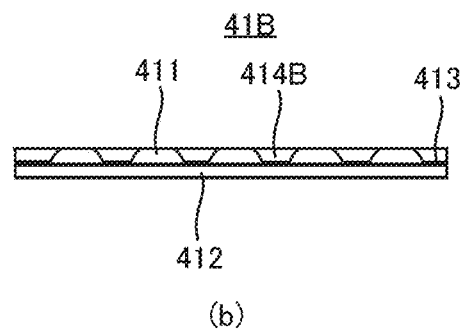

FIG. 2 is a set of cross-sectional views of alternative structures of the quantum-dot layer 41 shown in FIG. 1. The quantum-dot layer 41, in an embodiment of the present invention, may be a quantum-dot layer 41A shown in (a) of FIG. 2 or a quantum-dot layer 41B shown in (b) of FIG. 2.

Referring to (a) of FIG. 2, the quantum-dot layer 41A differs from the quantum-dot layer 41 shown in FIG. 1 where the partial capping layer 414 is replaced by a partial capping layer 414A, and is otherwise the same as the quantum-dot layer 41.

The partial capping layer 414A is provided on the quantum dots 411 and the wetting layer 413 so as to fit the quantum dots 411.

Referring to (b) of FIG. 2, the quantum-dot layer 41B differs from the quantum-dot layer 41 shown in FIG. 1 where the partial capping layer 414 is replaced by a partial capping layer 414B, and is otherwise the same as the quantum-dot layer 41.

The partial capping layer 414B has the same thickness as the quantum dots 411 and is provided on the quantum dots 411 and the wetting layer 413.

The partial capping layer, in an embodiment of the present invention, may be any of the partial capping layer 414 shown in FIG. 1 and the partial capping layers 414A and 414B shown in FIG. 2.

The photoelectric conversion layer 4, in an embodiment of the present invention, includes the single-sided barrier layer 43 as well as the quantum-dot layered structure. The single-sided barrier layer 43 is provided between the quantum-dot layers 41 and the n-type semiconductor layer 5 in contact with the quantum-dot layers 41 and the n-type semiconductor layer 5.

The single-sided barrier layer 43 is composed of, for example, $(Ga_{0.51}In_{0.49}P)_{1-x}(Al_{0.52}In_{0.48}P)_x$ ($0.4 < x \le 1$) or AlAs and has a thickness, for example, 40 nm.

Figure 3:
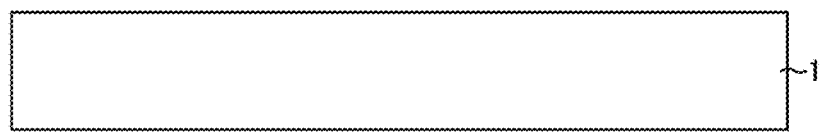
FIG. 3 is a first set of manufacturing step diagrams representing a method of manufacturing the infrared photodetector shown in FIG. 1.
Figure 3:
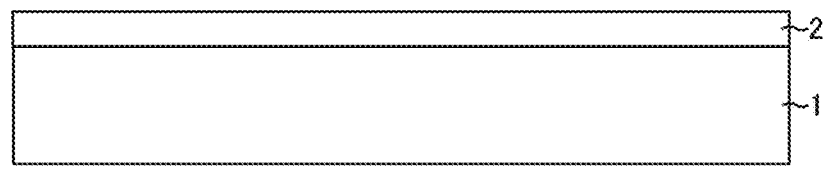
Figure 3:
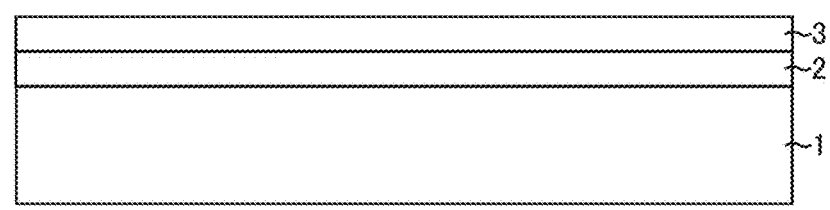
Figure 3:
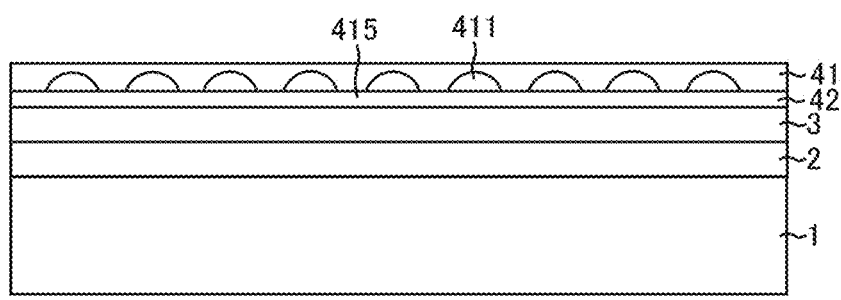
Figure 3:
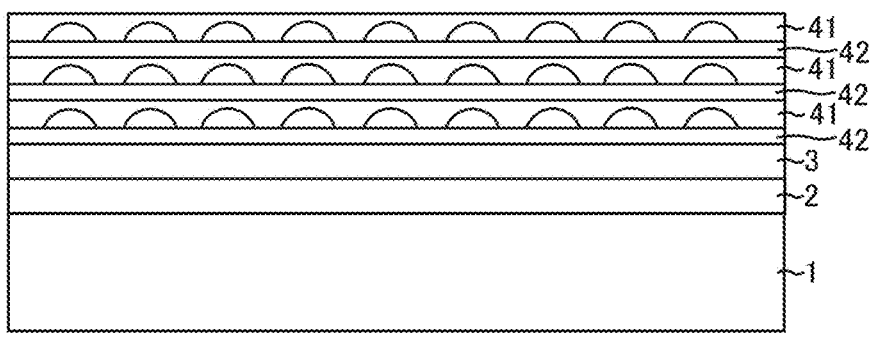
Figure 4:
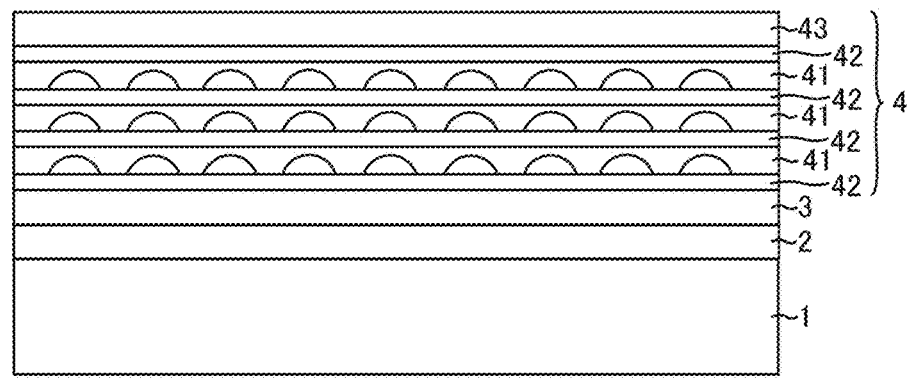
FIG. 4 is a second set of manufacturing step diagrams representing a method of manufacturing the infrared photodetector shown in FIG. 1.
Figure 4:
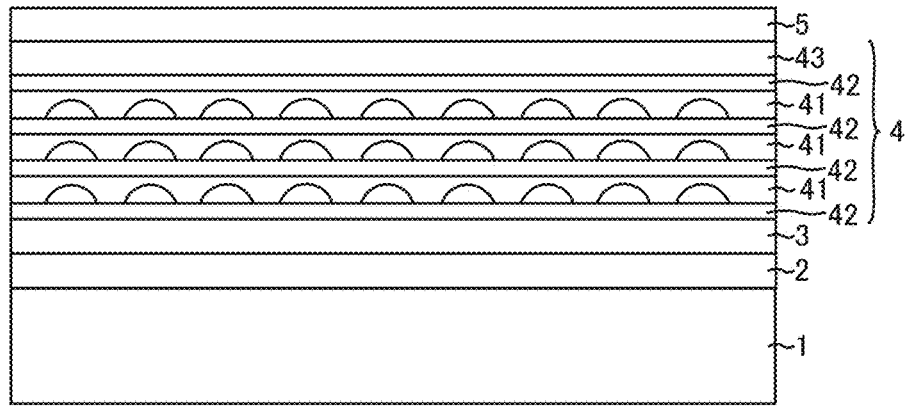
Figure 4:
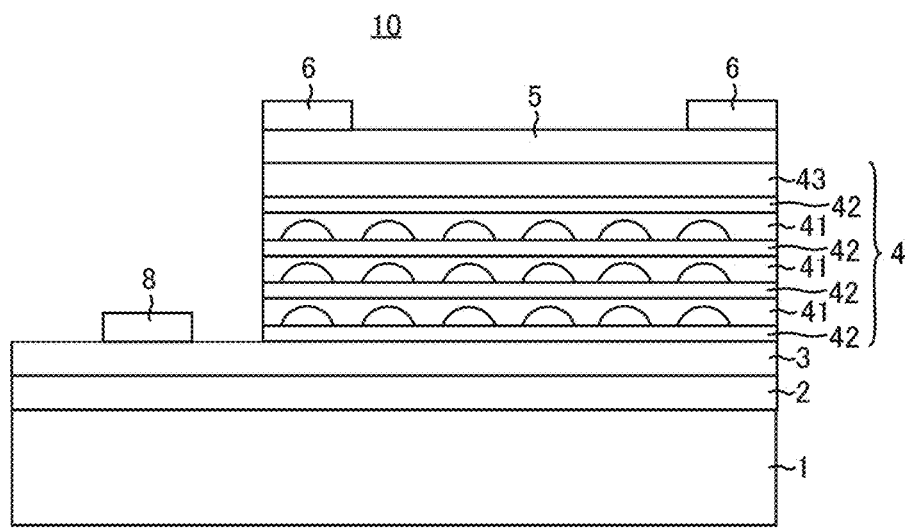

FIGS. 3 and 4 are first and second sets of manufacturing step diagrams, respectively, representing a method of manufacturing the infrared photodetector 10 shown in FIG. 1.

Referring to FIG. 3, at the start of the manufacture of the infrared photodetector 10, a semiconductor substrate 1 composed of semi-insulating GaAs is secured in a molecular beam epitaxy (MBE) device (step (a) in FIG. 3).

A buffer layer 2 is then formed on the semiconductor substrate 1 by MBE (step (b) in FIG. 3). More specifically, as an example, a 200-nm thick GaAs layer is formed that will serve as a buffer layer 2. The formation of the buffer layer 2 can improve the crystallinity of the photoelectric conversion layer 4 formed on the buffer layer 2, which in turn ensures that the photoelectric conversion layer 4 can exhibit a sufficient level of light-reception efficiency in the resultant infrared photodetector.

Subsequent to step (b), a n-type semiconductor layer 3 is formed on the buffer layer 2 by MBE (step (c) in FIG. 3). More specifically, as an example, a 1,000-nm n-GaAs layer is formed that will serve as a n-type semiconductor layer 3.

Subsequently, barrier layers 42 and quantum-dot layers 41 containing quantum dots 411 are formed on the n-type semiconductor layer 3 by MBE (step (d) in FIG. 3).

The quantum dots 411 here are formed by a method called Stranski-Krastanov (S-K) growth.

More specifically, a GaAs layer is crystalline grown that will serve as a barrier layer 42. Subsequently, the quantum dots 411 are formed of InAs by a self-assembly mechanism. In the formation of the quantum dots 411, the quantum dots 411 are doped with, for example, a n-type impurity. Thereafter, a GaAs layer is crystalline grown that will serve as a partial capping layer 414 to embed the quantum dots 411, which forms a quantum-dot layer 41.

Step (d) is then repeated, for example, 20 times to form, on the n-type semiconductor layer 3, a structure including a stack of quantum-dot layers 41 and barrier layers 42 (step (e) in FIG. 3).

The electrodes 6 and 8 are preferably gold and formed by vacuum vapor deposition using resistive heating.

Infrared light, as it enters the infrared photodetector 10, is absorbed by, and excites electrons in, the photoelectric conversion layer 4. The excited electrons are moved by an electric field and extracted to the electrodes 6 and 8 as a photocurrent. The photoelectric conversion layer 4 in the infrared photodetector 10 preferably absorbs infrared light by intersubband absorption. If a voltage is applied to the photoelectric conversion layer 4, the voltage is preferably such as to place the n-type semiconductor layer 5 (second contact layer) under negative bias.

Figure 5:
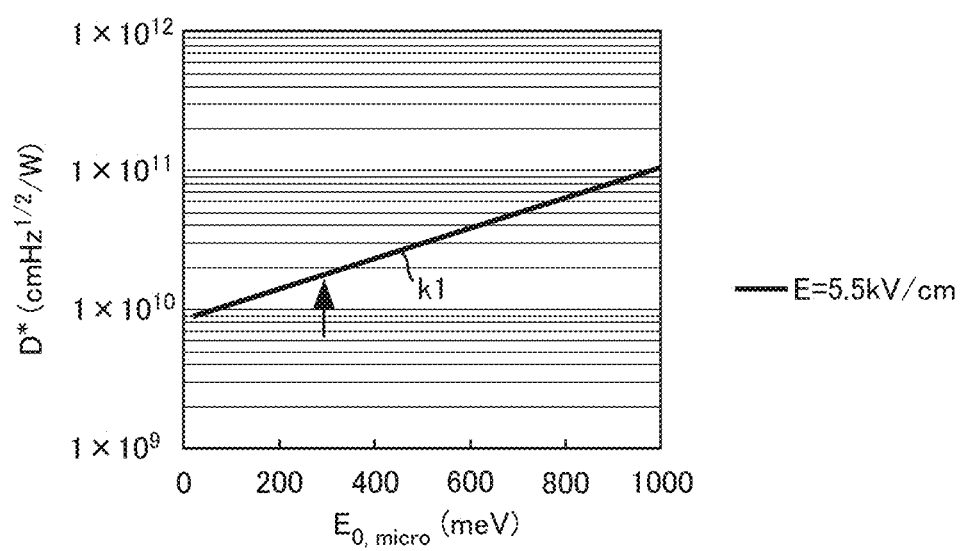
FIG. 5 is a diagram representing a relationship between detectivity and $E_{0,micro}$.

FIG. 5 is a diagram representing a relationship between detectivity and $E_{0,micro}$, where the vertical axis shows detectivity D* and the horizontal axis shows an energy level difference ($=E_{0,micro}$) between the bottom of the conduction band of the n-type semiconductor layer 5 and the bottom of the conduction band of the barrier layer.

Curved line k1 represents calculated detectivity D* when the photoelectric conversion layer 4 includes a stack of 70 quantum-dot layers 41, the photoelectric conversion layer 4 is placed under an electric field of 5.5 kV/cm, the operating temperature is 80 K, the activation energy $E_{0,nano}$ between the quantum dots 411 and the barrier layer 42 is 224.7 meV, and $E_{0,micro}$ is varied in a range of 20 to 1,000 meV.

Detectivity D* was calculated using the next formula given in Non-patent Literature 2.

Math. 1

$$D^* = \frac{\delta e g_p(N)\Sigma_{QD}K}{hv\sqrt{8g_n e^m v \left(\frac{m_b kT}{2\pi\hbar^2}\right)^{3/2} \exp\left(\frac{E_{0,micro}\exp(-E/E_0)E_{0,nano}-\beta E}{kT}\right)}} \quad (1)$$

Each barrier layer 42 is, for example, 40 nm thick.

Subsequent to step (e) in FIG. 3, the barrier layers 42 are formed, and the single-sided barrier layer 43 of $Al_{0.7}Ga_{0.3}As$ is formed on top of the barrier layers 42 (step (f) in FIG. 4), which forms the photoelectric conversion layer 4.

A n-type semiconductor layer 5 is then formed on the photoelectric conversion layer 4 by MBE (step (g) in FIG. 4). More specifically, as an example, a 500-nm thick n-GaAs layer is crystalline grown that will serve as a n-type semiconductor layer 5. This step forms a $n^+$-i-$n^+$ structure or a $n^+$-n-$n^+$ structure.

Subsequently, the laminate is removed from the MBE device. The photoelectric conversion layer 4 and the n-type semiconductor layer 5 are partially etched out by photolithography and wet etching, to form an electrode 6 on the n-type semiconductor layer 5 and an electrode 8 on the n-type semiconductor layer 3. That completes the manufacture of the infrared photodetector 10 (step (h) in FIG. 4).

In these manufacturing steps, as an example, Si may be used as a n-type dopant. The quantum dots 411 have been described as being doped with a n-type impurity in the foregoing manufacturing steps, which is by no means intended to limit the scope of the invention. Alternatively, in an embodiment of the present invention, any of the barrier layers 42 below the quantum dots 411, the partial capping layers 414, and the barrier layers 42 on the partial capping layer 414 may be doped. The doping enables efficient generation of carriers for photoexcitation.

In equation (1), k is Boltzmann's constant; T denotes an absolute temperature; h is Planck's constant; e denotes the elementary charge; $g_p$ denotes a photoconduction gain; $g_n$ denotes a noise gain; $m_b$ denotes the effective mass of an electron; N denotes an average number of carriers in a quantum dot; E denotes an electric field; and K denotes the number of quantum dots. As described in Non-patent Literature 3, $E_{0,micro}$ is an energy level difference between the bottom of the conduction band of the barrier layer and the bottom of the conduction band of the second contact layer under no bias, $E_{0,nano}$ is quantum dot ionization energy under no bias, and $E_0$ and $\beta$ are fitting parameters.

Activation energy $E_a$ for an element is given by the next formula.

Math. 2

$$E_a = E_{0,micro}\exp(-E/E_0) + E_{0,nano} - \beta E \quad (2)$$

Non-patent Literature 3 discloses that $E_{0,micro}$ is equal to 34.6 meV in an InAs/GaAs quantum-dot structure with no single-sided barrier layer. Data obtained when $E_{0,micro}=30$ to 40 meV, as an example, was used as comparative values in the verification detailed below.

An applied electric field of 5.5 kV/cm is assumed in the calculation shown in FIG. 5 because the average electric field for the case of Non-patent Literature 1, obtained by dividing an applied voltage by the thickness of a photoelectric conversion layer, is equal to approximately 5.5 kV/cm.

FIG. 5 shows detectivity D* increasing with an in increase in $E_{0,micro}$ (see curved line k1). The arrow shown in FIG. 5 indicates detectivity D* when $E_{0,micro}$=290 meV as disclosed in Non-patent Literature 1. As $E_{0,micro}$ increases from 30-40 meV to 290 meV, detectivity D* approximately doubles.

Meanwhile, curved line k1, which represents calculated detectivity D* when the photoelectric conversion layer 4 includes the single-sided barrier layer 43 of the present application, clearly indicates that if $E_{0,micro}$ increases from 30-40 meV to 1,000 meV, detectivity D* increases approximately by 11 folds.

An increase in $E_{0,micro}$ results in an increase in detectivity D* as demonstrated here.

Figure 6:
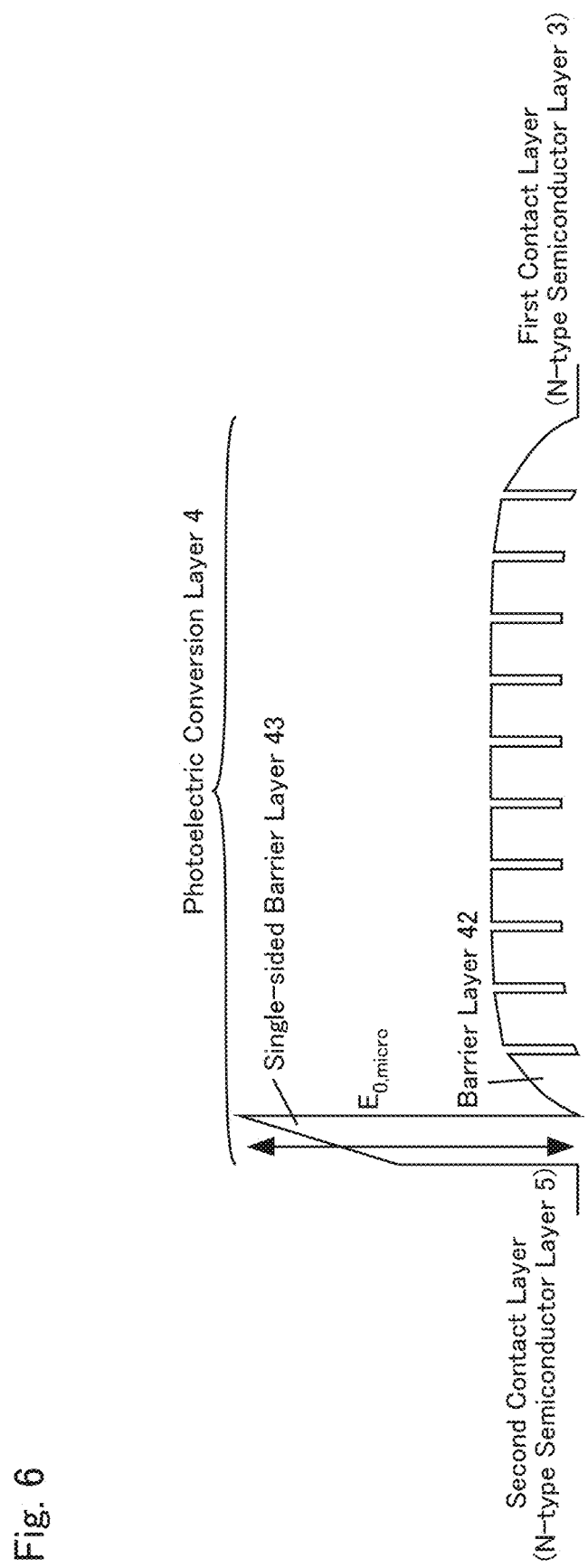
FIG. 6 is a schematic band diagram for conduction bands of a n-type semiconductor layer 3, a photoelectric conversion layer 4, and a n-type semiconductor layer 5 shown in FIG. 1.

FIG. 6 is a schematic band diagram for conduction bands of the n-type semiconductor layer 3, the photoelectric conversion layer 4, and the n-type semiconductor layer 5 shown in FIG. 1.

Referring to FIG. 6, variations of energy level difference $E_{0,micro}$ between the bottom of the conduction band of the n-type semiconductor layer 5 (second contact layer) and the bottom of the conduction band of the barrier layer can be estimated by self-consistently solving Schrödinger-Poisson equations.

To estimate energy level difference $E_{0,micro}$, simulation was carried out on a one-dimensional quantum well structure. Results of the simulation predict that energy level difference $E_{0,micro}$ be approximately equal to 290 meV if a single-sided barrier layer composed of $Al_{0.3}Ga_{0.7}As$ described in Non-patent Literature 1 is inserted into the second contact layer composed of GaAs.

The results also predict that energy level difference $E_{0,micro}$ be approximately equal to 570 meV if a single-sided barrier layer 43 of $Al_{0.7}Ga_{0.3}As$ is inserted into the same contact layer (see FIG. 6) and that energy level difference $E_{0,micro}$ increase approximately to 1,000 meV if a single-sided barrier layer 43 of AlAs is inserted into the same contact layer.

Therefore, the insertion of the single-sided barrier layer 43 would increase detectivity D* over the detectivity achieved when $E_{0,micro}$ is equal to 290 meV, as indicated by the arrow in FIG. 5 (see FIG. 5).

Figure 7:
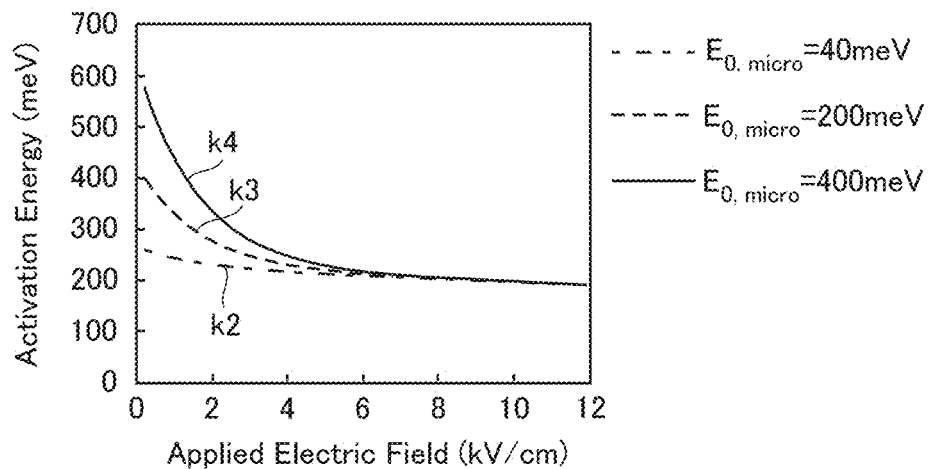
FIG. 7 is a diagram representing a relationship between activation energy and an applied electric field.

FIG. 7 is a diagram representing a relationship between activation energy and an applied electric field, where the vertical axis shows activation energy for an element and the horizontal axis shows an applied electric field. Additionally, curved line k2 represents a relationship between activation energy and an applied electric field when energy level difference $E_{0,micro}$ is equal to 40 meV, curved line k3 represents a relationship between activation energy and an applied electric field when energy level difference $E_{0,micro}$ is equal to 200 meV, and curved line k4 represents a relationship between activation energy and an applied electric field when energy level difference $E_{0,micro}$ is equal to 400 meV.

Curved lines k2 to k4 in FIG. 7 indicate that activation energy increases under weak applied electric field and also that activation energy increases with an increase in energy level difference $E_{0,micro}$ under weak applied electric field.

Therefore, activation energy can be increased by using a weak applied electric field and increasing energy level difference $E_{0,micro}$. Such a voltage that activation energy changes exponentially with respect to an electric field in the photoelectric conversion layer 4 is then applied to the photoelectric conversion layer 4 in an embodiment of the present invention.

Figure 8:
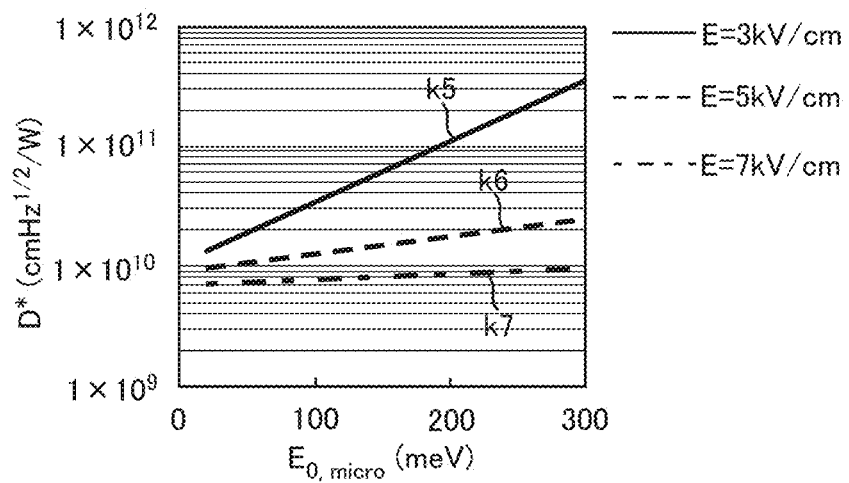
FIG. 8 is a diagram representing a relationship between detectivity and $E_{0,micro}$ under different applied electric fields.

FIG. 8 is a diagram representing a relationship between detectivity and $E_{0,micro}$ under different applied electric fields, where the vertical axis shows detectivity D* and the horizontal axis shows energy level difference $E_{0,micro}$. Additionally, curved line k5 represents a relationship between detectivity D* and $E_{0,micro}$ when the applied electric field is 3 kV/cm, curved line k6 represents a relationship between detectivity D* and $E_{0,micro}$ when the applied electric field is 5 kV/cm, and curved line k7 represents a relationship between detectivity D* and $E_{0,micro}$ when the applied electric field is 7 kV/cm.

Curved lines k5 to k7 in FIG. 8 indicate that detectivity D* increases with an increase in energy level difference $E_{0,micro}$ under each applied electric field and also that detectivity D* increases with a decreasing applied electric field when compared at the same energy level difference $E_{0,micro}$.

Therefore, detectivity D* can be improved by increasing energy level difference $E_{0,micro}$ and using a weak applied electric field.

Figure 9:
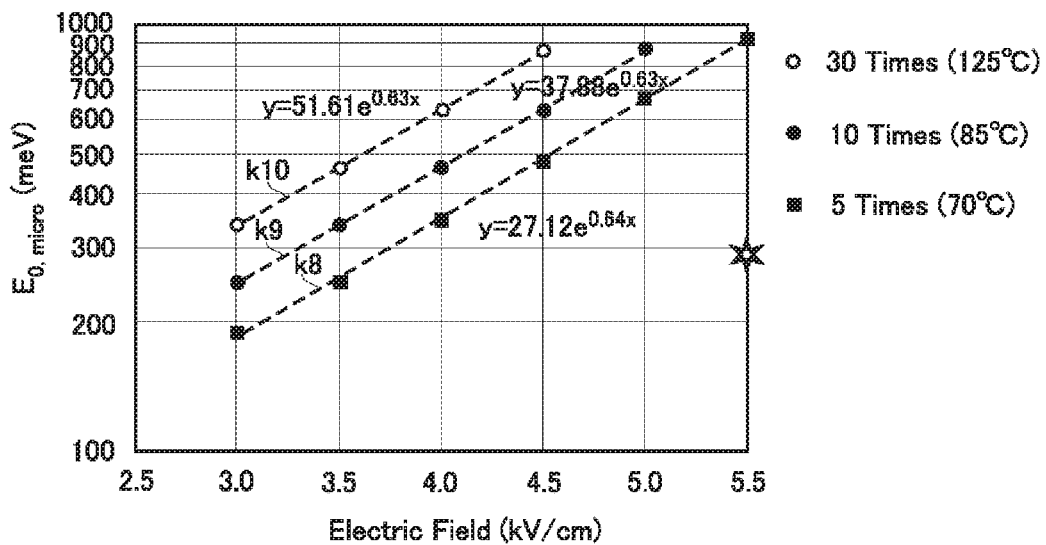
FIG. 9 is a diagram representing a relationship between energy level difference $E_{0,micro}$ and an electric field.

FIG. 9 is a diagram representing a relationship between energy level difference $E_{0,micro}$ and an electric field, where the vertical axis shows energy level difference $E_{0,micro}$ and the horizontal axis shows an electric field. Additionally, curved line k8 represents a relationship between energy level difference $E_{0,micro}$ and an electric field when detectivity D* is 5 times the detectivity given in Non-patent Literature 1, curved line k9 represents a relationship between energy level difference $E_{0,micro}$ and an electric field when detectivity D* is 10 times the detectivity given in Non-patent Literature 1, and curved line k10 represents a relationship between energy level difference $E_{0,micro}$ and an electric field when detectivity D* is 30 times the detectivity given in Non-patent Literature 1. The star symbol indicates the detectivity given in Non-patent Literature 1. In Non-patent Literature 1, energy level difference $E_{0,micro}$ is approximately equal to 290 meV, and the applied electric field is 5.5 kV/cm.

FIG. 9 shows that energy level difference $E_{0,micro}$ increases exponentially with an increasing electric field. Letting y be energy level difference $E_{0,micro}$ and x be the electric field applied to the photoelectric conversion layer 4, curved line k8 is given by y=27.12 exp(0.64x), curved line k9 is given by y=37.88 exp(0.63x), and curved line k10 is given by y=51.61 exp(0.63x).

With a combination of energy level difference $E_{0,micro}$ and an applied electric field found in the region located upper left to curved lines k8 to k10, detectivity D* is higher at respective operating temperatures of 70° C., 85° C., and 125° C. than in a typical thermal infrared photodetector. An infrared photodetector can be hence provided that utilizes quick response and wavelength selectivity which are characteristic to QDIPs.

Since x represents the electric field applied to the photoelectric conversion layer 4 as described above, letting z be the voltage in volts applied to the photoelectric conversion layer 4 and d be the thickness in nanometers of the photoelectric conversion layer 4, curved line k8 is given by y=27.12×exp(0.64×z/d×10000), curved line k9 is given by y=37.88×exp(0.63×z/d×10000), and curved line k10 is given by y=51.61×exp(0.63×z/d×10000). Note that z/d×10000 has a unit of kV/cm.

Therefore, the infrared photodetector 10 satisfies y≥27.12×exp(0.64×z/d×10000) when the operating temperature is 70° C., satisfies y≥37.88×exp(0.63×z/d×10000) when the operating temperature is 85° C., and satisfies y≥51.61×exp(0.63×z/d×10000) when the operating temperature is 125° C.

Next, simulation was carried out with respect to the energy level difference between the bottom of the conduction band of the barrier layer and the bottom of the conduction band of the contact layer (n-type semiconductor layer 5) with the material for the single-sided barrier layer 43 being changed to AlInGaP. AlInGaP provides good lattice matching with a substrate composed of GaAs.

Results of the simulation suggest that AlInGaP provides good lattice matching with a GaAs substrate if AlInGaP is $(Ga_{0.51}In_{0.49}P)_{1-z}$ $(Al_{0.52}In_{0.48}P)_z$ ($0<z<1$) and that the energy level difference is larger than energy level difference $E_{0,micro}$ assumed to be achieved in Non-patent Literature 1 (=approximately 290 meV) if $z>0.4$.

The results also suggest that energy level difference $E_{0,micro}$ is approximately equal to 390 meV if a single-sided barrier layer 43 composed of $(Ga_{0.51}In_{0.49}P)_{1-z}$ $(Al_{0.52}In_{0.48}P)_z$ ($z=0.7$) is inserted into a n-type semiconductor layer 5 (contact layer) composed of GaAs.

The results further suggest that energy level difference $E_{0,micro}$ is approximately equal to 470 meV if a single-sided barrier layer 43 composed of $(Ga_{0.51}In_{0.49}P)_{1-z}$ $(Al_{0.52}In_{0.48}P)_z$ ($z=0.9$) is inserted into a n-type semiconductor layer 5 (contact layer) composed of GaAs.

It is hence demonstrated that the insertion of the single-sided barrier layer 43 composed of AlInGaP is effective.

QDIPs have wavelength selectivity, which can be utilized for high-precision temperature detection and other purposes.

In contrast, general thermal infrared photodetectors lack wavelength selectivity and detect infrared light across a wide range of wavelengths.

A QDIP needs to have a peak sensitivity that is higher than a thermal infrared photodetector if the QDIP, having such wavelength selectivity, is to be used to detect infrared light across a wide range of wavelengths (e.g., in an application that makes thorough use of an 8 to 14 m band).

This requirement is also taken into account in a new estimate. More specifically, an estimate was made with respect to a QDIP that has a 10-μm detection peak, assuming consumer use and an atmospheric window of 8 to 14 μm. In the full width at half maximum of the detection peak of the QDIP, $\Delta\lambda/\lambda$ is typically approximately equal to 30%. A full width at half maximum of approximately 3 μm was used in the calculation.

Figure 10:
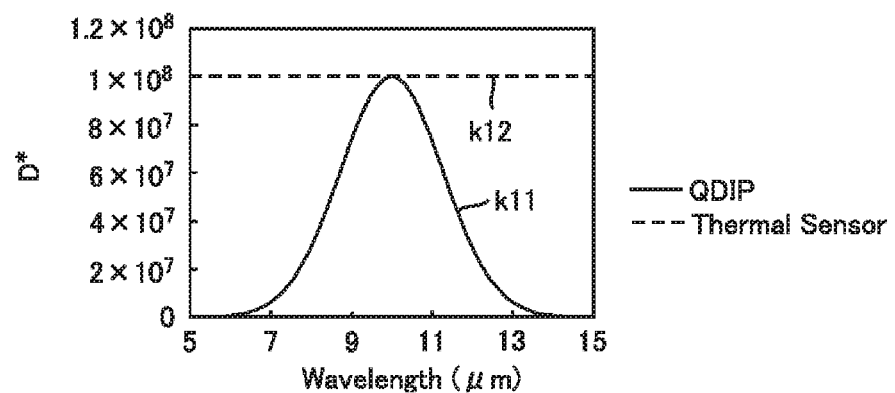
FIG. 10 is a diagram representing a relationship between detectivity and wavelength.

FIG. 10 is a diagram representing a relationship between detectivity and wavelength, where the vertical axis shows detectivity D* and the horizontal axis shows wavelength. Additionally, curved line k11 represents a relationship between detectivity D* and wavelength of a QDIP, and straight line k12 represents a relationship between detectivity D* and wavelength of a thermal sensor.

FIG. 10 shows that if infrared light is to be detected only in the 8 to 14 μm band, the QDIP needs to have sensitivity that is twice detectivity D* that is achieved by the use of the single-sided barrier layer 43 composed of $Al_{0.7}Ga_{0.3}As$ or AlAs, to obtain a signal that is equivalent to the signal delivered by a typical thermal infrared photodetector. In other words, detectivity D* needs to be equal to 2×5, 2×10, and 2×30 times the detectivity given in Non-patent Literature 1, that is, 10, 20, and 60 times the latter detectivity.

Figure 11:
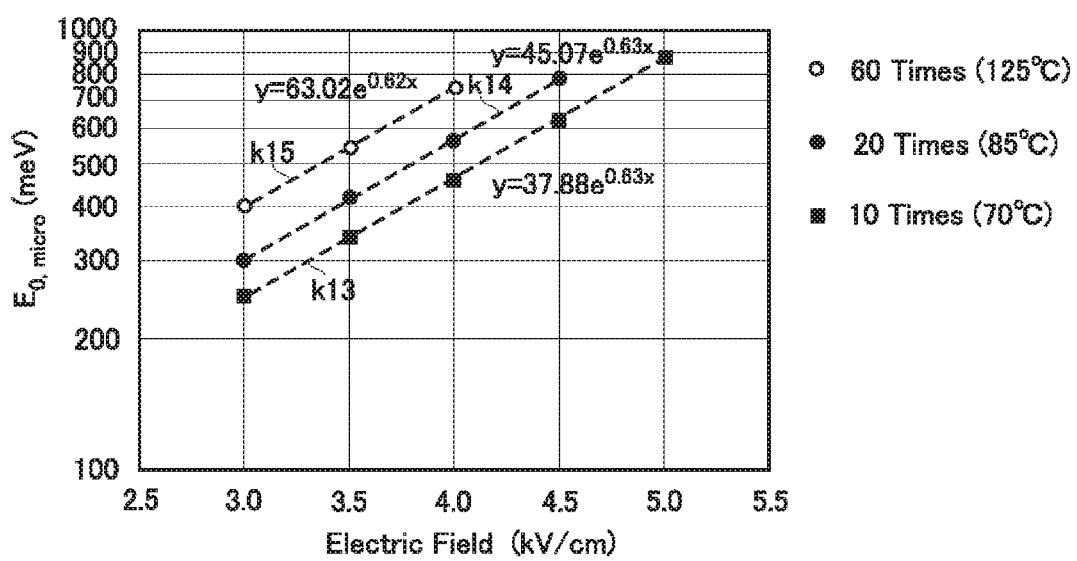
FIG. 11 is a diagram representing a relationship between energy level difference $E_{0,micro}$ and an electric field.

FIG. 11 is a diagram representing a relationship between energy level difference $E_{0,micro}$ and an applied electric field, where the vertical axis shows energy level difference $E_{0,micro}$ and the horizontal axis shows an applied electric field. Additionally, curved line k13 represents a relationship between energy level difference $E_{0,micro}$ and an applied electric field when detectivity D* is 10 times the detectivity given in Non-patent Literature 1, curved line k14 represents a relationship between energy level difference $E_{0,micro}$ and an applied electric field when detectivity D* is 20 times the detectivity given in Non-patent Literature 1, and curved line k15 represents a relationship between energy level difference $E_{0,micro}$ and an applied electric field when detectivity D* is 60 times the detectivity given in Non-patent Literature 1.

In FIG. 11, curved line k13 is given by y=37.88 exp (0.63x), curved line k14 is given by y=45.07 exp(0.63x), and curved line k15 is given by y=63.02 exp(0.62x).

Rewriting these equations using voltage z and thickness d instead of x, curved line k13 is given by y≥37.88×exp(0.63× z/d×10000), curved line k14 is given by y≥45.07×exp(0.63× z/d×10000), and curved line k15 is given by y≥63.02×exp (0.62×z/d×10000).

With a combination of energy level difference $E_{0,micro}$ and an applied electric field found in the region located upper left to the approximation lines indicated by curved lines k13 to k15, the detectivity would be approximately equal to that in a typical thermal infrared photodetector at respective operating temperatures of 70° C., 85° C., and 125° C.

In other words, the infrared photodetector 10 satisfies y≥37.88×exp(0.63×z/d×10000) when the operating temperature is 70° C., satisfies y≥45.07×exp(0.63×z/d×10000) when the operating temperature is 85° C., and satisfies y≥63.02×exp(0.62×z/d×10000) when the operating temperature is 125° C.

An infrared photodetector can be hence provided that utilizes quick response and wavelength selectivity which are characteristic to QDIPs.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The present invention is applicable to infrared photodetectors.

REFERENCE SIGNS LIST

1 Semiconductor Substrate
2 Buffer Layer
3, 5 N-type Semiconductor Layer
4 Photoelectric Conversion Layer
6, 8 Electrode
10 Infrared Photodetector
41 Quantum-dot Layer
42 Barrier Layer
43 Single-sided Barrier Layer
411 Quantum Dot
412 Underlayer
413 Wetting Layer
414 Partial Capping Layer

What is claimed is:
1. An infrared photodetector comprising:
a first contact layer;
a second contact layer; and
a photoelectric conversion layer provided between the first and second contact layers in contact with the first and second contact layers, the photoelectric conversion layer being doped with an impurity, wherein
the photoelectric conversion layer comprises:
a quantum layer;
a barrier layer; and a single-sided barrier layer provided between the barrier layer and the second contact layer in contact with the barrier layer and the second contact layer, the single-sided barrier layer having a wider band gap than does the barrier layer, and letting y be an energy level difference between a bottom of a conduction band of the single-sided barrier layer and a bottom of a conduction band of the second contact layer, z be a voltage in volts applied to the photoelectric conversion layer, and d be a thickness in nanometers of the photoelectric conversion layer, the infrared photodetector satisfies y≥27×exp(0.64×z/d×10000).

2. The infrared photodetector according to claim 1, wherein the photoelectric conversion layer absorbs infrared light by intersubband absorption.

3. The infrared photodetector according to claim 1, wherein the quantum layer contains quantum dots.

4. The infrared photodetector according to claim 1, wherein voltage z in volts, applied to the photoelectric conversion layer, is such as to place the second contact layer under negative bias.

5. The infrared photodetector according to claim 1, wherein both the first and second contact layers are composed of n-type GaAs.

6. The infrared photodetector according to claim 1, wherein the single-sided barrier layer has a composition of $(Ga_{0.51}In_{0.49}P)_{1-x}(Al_{0.52}In_{0.48}P)_x$ (0.4<x≤1).

7. The infrared photodetector according to claim 1, wherein the single-sided barrier layer has a composition of AlAs.

8. The infrared photodetector according to claim 1, wherein voltage z in volts, applied to the photoelectric conversion layer, is such that activation energy changes exponentially with respect to an electric field in the photoelectric conversion layer.

* * * * *